United States Patent
Christiaans et al.

(10) Patent No.: US 10,439,510 B2
(45) Date of Patent: Oct. 8, 2019

(54) LOAD CURRENT MEASUREMENT

(71) Applicant: NXP B.V., Eindhoven (NL)

(72) Inventors: Peter Christiaans, Mountain View, CA (US); Robert Glenn Crosby, II, Livermore, CA (US); Fu Chun Zhan, Shanghai (CN)

(73) Assignee: NXP B.V., Eindhoven (NL)

( * ) Notice: Subject to any disclaimer, the term of this patent is extended or adjusted under 35 U.S.C. 154(b) by 95 days.

(21) Appl. No.: 15/458,734

(22) Filed: Mar. 14, 2017

(65) Prior Publication Data

US 2017/0264211 A1 Sep. 14, 2017

(30) Foreign Application Priority Data

Mar. 14, 2016 (CN) .......................... 2016 1 0143118

(51) Int. Cl.
*G01R 15/16* (2006.01)
*H02M 7/219* (2006.01)
(Continued)

(52) U.S. Cl.
CPC ............ *H02M 7/219* (2013.01); *G01R 15/16* (2013.01); *G01R 19/0092* (2013.01);
(Continued)

(58) Field of Classification Search
CPC ........... H02M 2001/009; H02M 7/219; H02M 2001/0009; H02M 2007/2195; G01R 15/16; G01R 19/0092; H02J 50/12; H02J 7/025

See application file for complete search history.

(56) References Cited

U.S. PATENT DOCUMENTS 5,097,403 A 3/1992 Smith
2005/0105311 A1* 5/2005 Soldano .............. H02M 1/4225
363/89

(Continued)

FOREIGN PATENT DOCUMENTS

CN 102395987 A 3/2012
CN 104009625 A 8/2014
CN 104638953 A 5/2015

OTHER PUBLICATIONS

Maxim Integrated Products, "Application Note 746—High-Side Current-Sense Measurement: Circuits and Principles", Nov. 19, 2001, 13 pages.

*Primary Examiner* — Jeffrey A Gblende
*Assistant Examiner* — Lorena D Bruner

(57) ABSTRACT

In an example embodiment, an apparatus includes a bridge rectifier circuit having branches between the AC and DC nodes formed by a set of transistors. A load current measurement circuit includes a current-controlled current source coupled to the bridge rectifier circuit. The current control current source is configured to generate a mirrored current that is a scaled version of a current through at least one of the set of transistors. A current integration circuit is configured to integrate the mirrored current by charging a capacitor with the scaled current in a first mode and discharging the capacitor in a second mode. A sample and hold circuit is configured to set an output node to a voltage equal to a voltage stored by the capacitor in response to the current integration circuit entering the second mode and prior to the discharge of the capacitor.

20 Claims, 7 Drawing Sheets

(51) Int. Cl.
*G01R 19/00* (2006.01)
*H02J 7/00* (2006.01)
*H02J 7/02* (2016.01)
*H02J 7/04* (2006.01)
*H02M 1/00* (2006.01)

(52) U.S. Cl.
CPC ............ *H02J 7/0047* (2013.01); *H02J 7/027* (2013.01); *H02J 7/045* (2013.01); *H02M 2001/0009* (2013.01); *H02M 2007/2195* (2013.01); *Y02B 70/1408* (2013.01)

(56) References Cited

U.S. PATENT DOCUMENTS

| | | | |
|---|---|---|---|
| 2010/0165686 A1* | 7/2010 | Matzberger | H02M 7/219 363/127 |
| 2011/0057724 A1* | 3/2011 | Pabon | H02M 7/219 327/581 |
| 2012/0069605 A1* | 3/2012 | Choi | H02M 3/337 363/21.02 |
| 2013/0043941 A1 | 2/2013 | Dong et al. | |
| 2013/0154714 A1 | 6/2013 | Friend et al. | |
| 2014/0225447 A1* | 8/2014 | Teggatz | H02J 17/00 307/104 |
| 2017/0063228 A1* | 3/2017 | Kimura | H02M 3/158 |

\* cited by examiner

LOAD CURRENT MEASUREMENT

OVERVIEW

Aspects of various embodiments are directed to power conversion circuits. In various applications, current through a load circuit powered by a power converter may be monitored, for example, to protect a power converter and/or load. Particular aspects relate to wireless charging stations and devices.

Wireless power transfer is increasingly being used in various applications to deliver power for activating one or more functions and/or operate devices without the requirements of a (working) battery or main power supply inside of devices. A variety of wireless power transfer approaches may be implemented to suit particular embodiments. For example, inductive power, or resonant inductive power, can be used to power a load by inducing an alternating current (AC) in a coil coupled to the AC nodes of the rectifier by generating an alternating electromagnetic field.

For ease of reference, current provided to the load may be referred to as the load current. Some techniques for sensing load current place an external resistor in series with the load and measure a voltage drop across the resistor. The voltage drop across the resistor is proportional to the load current and inversely proportional to the resistance value of the resistor.

These and other matters have presented challenges to efficiencies of power converter implementations, for a variety of applications.

SUMMARY

Various example embodiments are directed to an apparatus including a bridge rectifier circuit. The bridge rectifier circuit has first and second AC nodes, first and second direct current (DC) nodes, and a set of transistors forming branches between the AC and DC nodes. The apparatus also includes a load current measurement circuit coupled to the bridge rectifier. The load current measurement circuit includes a current-controlled current source coupled to the bridge rectifier circuit and configured to generate a mirrored current that is a scaled version of a current through at least one of the set of transistors. A current integration circuit is configured to integrate the mirrored current by charging a capacitor with the scaled current in a first mode and discharging the capacitor in a second mode. A sample and hold circuit is configured to set an output node to a voltage equal to a voltage stored by the capacitor in response to the current integration circuit entering the second mode and prior to the discharge of the capacitor. The voltage is indicative of an average current through a load connected to the DC nodes.

Some example embodiments are directed to methods for operating a power converter. Using a bridge rectifier circuit, an AC voltage between first and second AC nodes is converted to a DC voltage between first and second DC nodes. A mirrored current is generated that is a scaled version of a current through at least one branch in the bridge rectifier circuit. In a first mode, a capacitor is charged with the mirrored current. In a second mode, a voltage stored by the capacitor is sampled. After sampling the voltage, an output node is set to a voltage equal to the sampled voltage and the capacitor is discharged.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
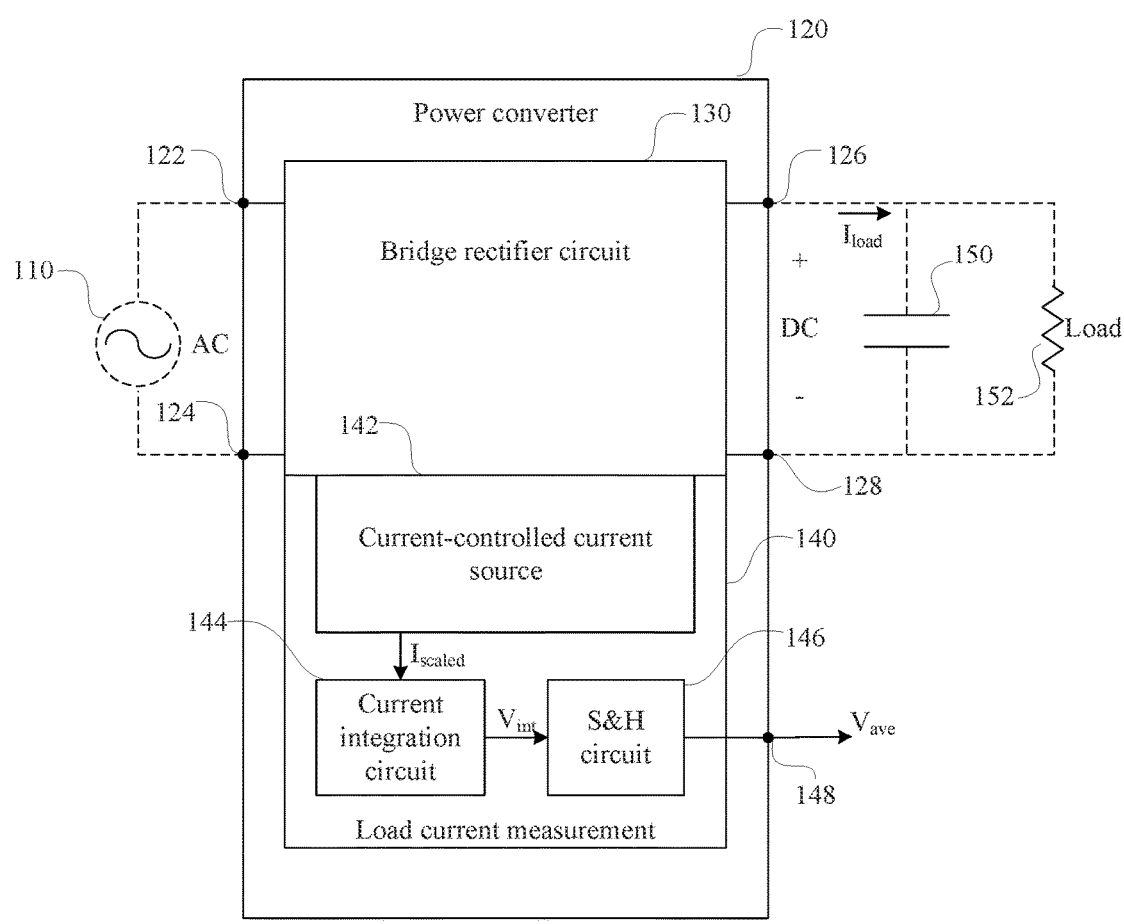
FIG. 1 shows a block diagram of a power converter circuit, consistent with one or more embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving power conversion. In certain implementations, aspects of the present disclosure have been shown to be beneficial when used in the context of AC to DC power conversion systems. While not necessarily so limited, various aspects may be appreciated through a discussion of examples using such exemplary contexts.

Various embodiments include aspects based upon the recognition that the use of external resistors to measure load currents can increase manufacturing and operating costs. For instance, accuracy of load current measurement depends on the accuracy of this external resistor. A high resistance can value for the resistor can create a large voltage drop and dissipate a lot of power, which can negatively affect the properties of the power converter. A low resistance, however, can reduce the sensitivity of the current measurements. Moreover, various resistors can be subject to resistance variations due to environmental temperature changes. The use of a temperature insensitive shunt resistor with a low resistance value demands extra attention and effort, which makes it more difficult to sense the load current. Measurement of load current with an external resistor may also require an additional pin in the integrated circuit package to input the determined load current to control circuitry of the power converter. The addition of the pin increases the package area and may be less suitable for compact applications, such as wearable devices. Sensing load current using a resistor in series with the load also decreases power efficiency because the resistor continuously consumes power even when load current measurement is not needed.

Various example embodiments are directed to circuits and methods for determining current through a load connected to a power converter. In some embodiments, a power converter includes a bridge rectifier circuit configured to generate a DC voltage at a pair of DC nodes from an AC voltage provided to a pair of AC nodes. The bridge rectifier circuit includes a set of transistors forming branches between the AC and DC nodes. The power converter also includes a load current measurement circuit coupled to the bridge rectifier circuit. The load current measurement circuit includes a current-controlled current source coupled to the bridge rectifier circuit. The load current measurement circuit is configured to generate a mirrored current that is a scaled version of a current through at least one of the set of transistors. A current integration circuit is configured to integrate the mirrored current for a period of time by charging a capacitor with the scaled current in a first mode and discharging the capacitor in a second mode. A sample and hold circuit is configured to set an output node to a voltage equal to a voltage stored by the capacitor in response to the current integration circuit entering the second mode and prior to the discharge of the capacitor. The voltage is indicative of an average current through a load connected to the DC nodes.

In a number of embodiments, the load current measurement circuit may charge the capacitor for different periods of time before the capacitor is discharged. For instance, in some implementations, the load current measurement circuit may be configured to discharge the capacitor at the end of each cycle of the AC voltage provided to the power converter. In some other implementations, the load current measurement circuit may be configured to charge the capacitor for multiple cycles of the AC voltage before the capacitor is discharged. Charging the capacitor for multiple cycles may reduce unwanted variances in the average load current measurement by taking an average over a longer period of time. For example, the frequency of the AC voltage provided to a power converter may have significant variances. If the length of time that the current is integrated is set based upon the AC voltage cycles, then variations in the AC frequency can create discrepancies in the measured current value (e.g., by changing the length of the integration period. This can be particularly relevant for lower frequency AC power transfer, as AC power at lower voltages can tend to exhibit greater variation in the length of cycles. For ease of reference, the period of time in which the capacitor is charged with the mirrored current without discharging the capacitor may be referred to as the measurement period. In some implementations, the measurement period used by the load current measurement circuit may be adjusted in response to a value control signal input to the power converter or stored in a register or memory included in the power converter.

In some embodiments, the capacitor may be implemented using a programmable capacitor that may be adjusted to exhibit different capacitances. The capacitance may be adjusted, for example, to facilitate adjustment of the measurement period. For instance, smaller capacitance values will result in faster charging for similar current conditions. The precision (the effective resolution) of voltage measurements (e.g., taken by an analog-to-digital converter (ADC)) can be a function of the voltage that is measured relative to the current being measured. Two factors in determining this voltage are the size of the capacitance and the length of time that the capacitor is allowed to charge after a discharge and before measurement. Accordingly, by reducing the capacitance, the charge time can be reduced while maintaining the same precision in the measurement (e.g., having the same output voltage for a particular current value). If the capacitance is reduced sufficiently, the capacitor can be measured and discharged every cycle of the AC voltage.

Additionally or alternatively, the capacitance of the capacitor may be adjusted to compensate process variations in order to increase accuracy of determined load current. For instance, it is recognized that smaller capacitor values can be increase the susceptibility of the digital measurement to capacitance variations (e.g., due to process variations). Accordingly, trimming of the capacitance value can be used to mitigate such variations. Trimming might include, for example, the use of a calibration mode during which a known current is supplied as a reference. The voltage on the capacitor can then be measured and the capacitance value iteratively adjusted until the measured voltage is within a desired threshold value.

The capacitance value of the capacitor may be programmed using various processes. In some implementations, the capacitor may be programmed to exhibit a capacitance value specified by a control signal input to the power converter during operation. In some other implementations, the power converter may be configured to program the capacitor to exhibit a capacitance a value specified in a register or memory included in the power converter.

In some embodiments, the load current measurement circuit may also include an ADC circuit configured to quantize the average voltage ($V_{ave}$) to produce a digital value. Average load current may be determined from the digital value, for example, using a lookup table indicating load currents for a plurality of voltage levels. Alternatively, average load current may be determined from the digital value, for example, using an algorithm as part of a conversion process. An example conversion process is described in more detail with reference to FIG. 3. In some embodiments, the power converter may be configured to adjust operation of the power converter based on the determined load current. For example, the power converter may be configured to disable the bridge rectifier circuit in response to load current exceeding a threshold current level.

In some embodiments, the determined load current may be provided to an external circuit communicatively coupled to the power converter. For example, the load-current measurement circuit may be configured to communicate the determined load current to a wireless charger configured to wirelessly provide AC power to the power converter. Wireless power transfer is increasingly being used in various applications to deliver power for activating one or more functions and/or operate devices without the requirements of a (working) battery or main power supply inside of devices. A variety of wireless power transfer approaches may be implemented to suit particular embodiments. For example, inductive power, or resonant inductive power, can be used to induce an AC current in a coil coupled to the AC nodes of the rectifier by generating an alternating electromagnetic field. The determined current may be communicated from the power converter to the wireless charger, for example using a communication channel out of band of the frequency used for power transfer and/or using available in-band communication channel embedded with wireless power transfer. In some implementations, rather than determining the load current at the power converter, the digital value may be communicated to the wireless charger. The wireless charger may determine the load current from the digital value, for example, using a lookup table stored in a non-volatile memory of the wireless charger.

The wireless charger may be configured to perform various operations based on the determined load current. For example, in some implementations, the wireless charger may be configured to adjust frequency used for power transfer based on the determined load current. As another example, the wireless charger may be configured to stop wireless transfer of power in response to load current exceeding a threshold current level.

Turning now to the figures, FIG. 1 shows a block diagram of a power converter circuit, consistent with one or more embodiments of the present disclosure. According to various embodiments, the power converter circuit can be part of a device that receives AC power from an external source. For example, the external source can be a wireless charging station and the AC power source 110 can include an inductive coil that receives power from the wireless charging station.

According to embodiments, the power converter 120 can include a bridge rectifier circuit 130 configured to generate a DC voltage at nodes 126 and 128 from an AC voltage provided to nodes 122 and 124. A load 152, such as a battery charging circuit, can then be power from the DC voltage. Consistent with various embodiments, one or more of the components depicted in FIG. 1 can be included as part of an integrated circuit (IC) package.

Consistent with a number of embodiments of the present disclosure, the device that includes the power converter circuit is designed to determine a value for the average current through the load 152. This determined value can then be used by the device for a variety of purposes including, but not limited to, communication with a wireless charging source of AC power. For example, certain wireless charging standards (e.g., as defined by the Alliance for Wireless Power (A4WP)) specify that the average load current be reported to the power sourcing device. Moreover, the standards may specify a required current-reporting accuracy for devices receiving the power. Accordingly, the power converter 120 can include a load current measurement circuit 140 coupled to the bridge rectifier circuit 130.

According to various embodiments, the load current measurement circuit 140 can be configured to provide an indication of a current $I_{load}$ through the load circuit 152 coupled to the power converter 120 via nodes 126 and 128. In some applications, a filter circuit (e.g., capacitor 150) may also be connected to the nodes 126 and 128 to smooth the DC voltage provided by the bridge rectifier circuit 130 at nodes 126 and 128. As discussed herein, the use of a power resistor connected in series with the load 152 can have a number of potential issues. Consistent with this recognition, a number of embodiments are directed toward mirroring the current through a branch of the bridge rectifier circuit and to integrating the mirrored current.

In particular embodiments, the load current measurement circuit 140 includes a current-controlled current source 142 coupled to the bridge rectifier circuit. The current-controlled current source 142 is configured to generate a mirrored current ($I_{scaled}$) that is a scaled version of a current through a branch in the bridge rectifier circuit 130. A current integration circuit 144 is configured to integrate the mirrored current by charging a capacitor with the scaled current in a first (integration) mode and discharging the capacitor in a second (sample and discharge) mode. A sample and hold circuit 146 is configured to set an output node 148 to a voltage ($V_{ave}$) equal to a voltage ($V_{int}$) stored by the capacitor in response to the current integration circuit entering the second mode and prior to the discharge of the capacitor. The $V_{ave}$ voltage is indicative of average current (Iload) provided to the load 152 by the bridge rectifier circuit 130.

Figure 2:
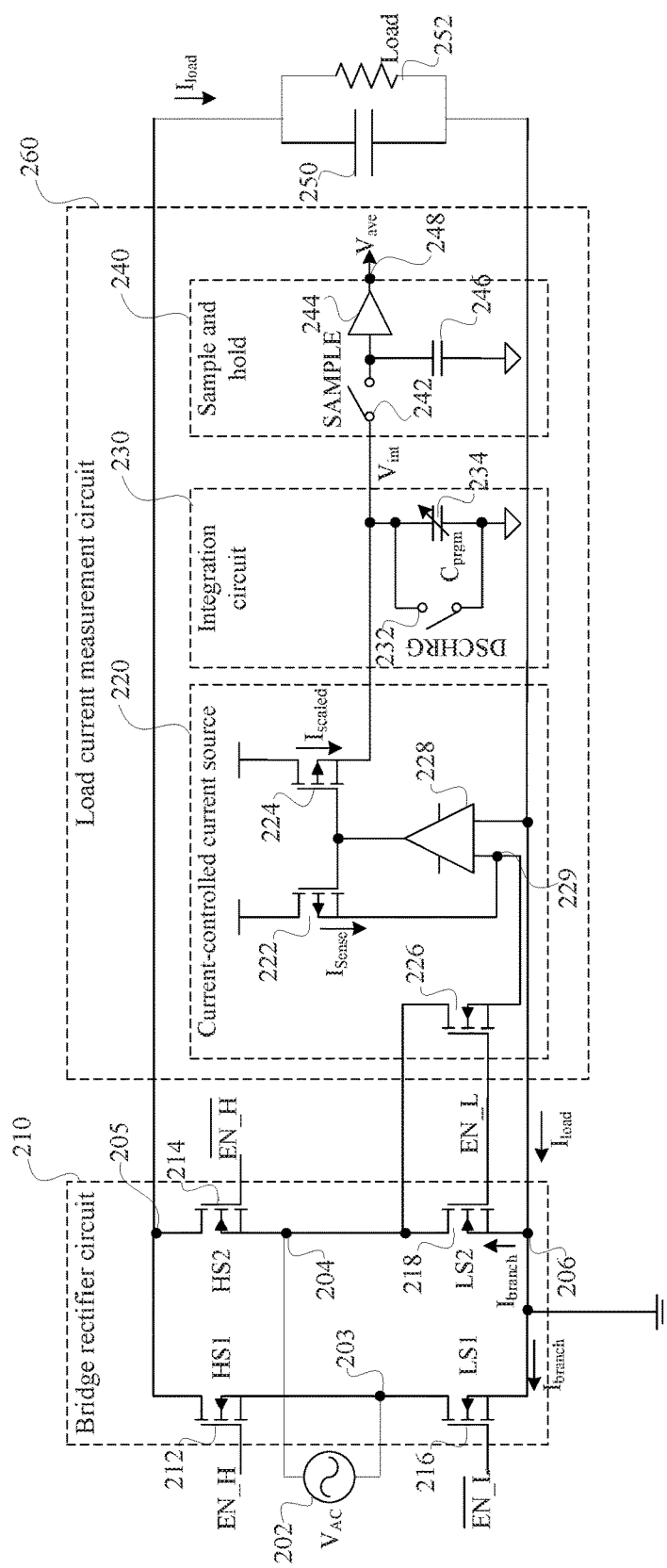
FIG. 2 shows a block diagram of a power converter circuit, consistent with one or more embodiments of the present disclosure.

FIG. 2 shows a block diagram of a power converter circuit, consistent with one or more embodiments of the present disclosure. The power converter circuit includes a bridge rectifier circuit 210 and a load current measurement circuit 260. The load current measurement circuit 260 can include a current-controlled current source 220, an integration circuit 230, and a sample-and-hold circuit 240. Each of these circuits can be used and arranged as described with reference to bridge rectifier circuit 130, load current measurement circuit 140, a current-controlled current source 142, an integration circuit 144, and a sample-and-hold circuit 146 in FIG. 1.

The bridge rectifier circuit 210 is configured to generate a DC voltage at DC nodes 205 and 206 from an AC voltage provided by an AC voltage source 202 coupled to AC nodes 203 and 204. In this example, the bridge rectifier circuit 210 is an active rectifier, having branches between the AC and DC nodes formed by respective transistors 212, 214, 216, and 218. High-side transistors 212 and 214 are switched by control signals EN_H and $\overline{EN\_H}$ to connect DC node 205 to whichever one of the AC nodes 203 or 204 that has the higher voltage (and thereby provide a corresponding current path). $\overline{EN\_H}$ is the inverse of EN_H. Conversely, low-side transistors 216 and 218 are switched by the control signals EN_L and $\overline{EN\_L}$ to connect DC node 206 to whichever one of the AC nodes 203 or 204 that has the lower voltage. While separate control signals can be used for each of the high-side and low-side transistors to more precisely control the timing with respect to one another, the signals can be synchronized or very close to synchronized. For ease of discussion, the corresponding signals may be collectively referred to herein as simply "EN."

The load current measurement circuit 260 is configured to provide an indication of a current $I_{load}$ through a load circuit 252 coupled to the power converter 120 via nodes 126 and 128. In this example, a filter capacitor 250 is also connected to the nodes 205 and 206 to smooth the DC voltage provided by the bridge rectifier circuit 210. Various other filter circuits can be used in connection the DC voltage output to the load circuit 252.

The current-controlled current source 220 is configured to generate a mirrored current that based upon current(s) through transistors 212, 214, 216, and/or 218 forming branches in the bridge rectifier circuit 210. Each low-side transistor 216 and 218 is switched on for a respective half of each cycle of the AC voltage. Accordingly, the amount of current ($I_{branch}$) passed by each low-side transistor 216 and 218 is equal to approximately half of the average of the load current. Similarly, the current through each high-side transistor 212 and 214 is equal to approximately half of the average of the load current. In this example, the current-controlled current source 220 is configured to generate a mirrored current that is proportional to the current through a single low-side transistor 218. Alternatively, in some embodiments, the current-controlled current source 220 may be configured to generate a mirrored current proportional to current passed by a single one of the high side transistors 212 or 214, by both high side transistors 212 and 214, or by both low-side transistors 216 and 218.

According to embodiments, current-controlled current source 220 can include a pair of transistors 222 and 226 that are connected in series between a voltage source and one AC node 204, which is connected to low side transistor 218. Transistor 226 is configured to The current ($I_{sense}$) passed by transistor 222 is adjusted by comparator 228 to maintain voltage at node 229 equal to the voltage at DC node 206, which is tied to ground. In this manner, the circuit operates as a fast regulation loop in which node 229 serves as a virtual ground for transistor 226. With the voltage of nodes 206 and 229 being equal, the current passed by transistor 226 is proportional to the $I_{branch}$ current passed by the low-side transistor 218. The current-controlled current source 220 also includes a transistor 224 having a gate connected to a gate of transistor 222. In this arrangement, transistor 224 mirrors the current passed by transistor 222 to produce the mirrored $I_{scaled}$ current.

The scale ratio of the $I_{scaled}$ current to the current through the low-side transistor depends on the relative sizes of the 218, 226, 222, and 224 transistors. More specifically, the $I_{scaled}$ current is equal to the product of a first ratio of the size of transistor 218 to the size of transistor 226 multiplied by a second ratio of the size of transistor 222 to the size of transistor 224. As an illustrative example, a mirrored current $I_{scaled}$ that is 1/2000th of the current passed by the low-side transistor may be generated by implementing transistor 226 to be $1/500^{th}$ of the size of low-side transistor 218 and implementing transistor 224 to be $1/4^{th}$ of the size of transistor 222.

The current integration circuit 230 is configured to integrate the $I_{scaled}$ current over a measurement period. In this example, the integration circuit 230 includes a capacitor 234 and switch 232. During a measurement period, DSCHRG is set to logic 0. In response to DSCHRG being set to logic 0, switch 232 is opened and the capacitor 234 is charged with the $I_{scaled}$ current. At the end of the measurement period, the charge on the capacitor 234 is indicative of an average current passed by the low side transistor 218 during the measurement period. At a time following the measurement period, DSCHRG is set to logic 1. In response to DSCHRG being set to the logic 1, the switch 232 is closed and the capacitor 234 is discharged in preparation for integrating current in the next measurement period. In some embodiments, the capacitor may be implemented using a variable capacitor as shown in FIG. 2. As previously discussed, in some implementations, trimming of the capacitor can be used to precisely control the capacitance value, as previously discussed.

A sample and hold circuit 146 is configured to set, responsive to a SAMPLE control signal, an output node 148 to a voltage ($V_{ave}$) equal to a voltage ($V_{int}$) stored by the capacitor 234. In this example, the sample and hold circuit 240 includes a capacitor 246 and a switch 242 configured to couple the capacitor 234 to the capacitor 246 when the SAMPLE control signal is set to logic 1. When the switch 242 is closed, the capacitor 246 is set to the voltage of capacitor 234. When the switch 242 is opened, the voltage of capacitor 246 is maintained. The sample and hold circuit 240 also includes a driver 244 configured to set an output node 248 to the voltage of capacitor 246.

Following the measurement period and prior to the discharge of the capacitor 234, the SAMPLE control signal is set to logic 1 and capacitor 246 is charged to the $V_{int}$ voltage stored by capacitor 234. As previously discussed, at this point in time the $V_{int}$ voltage is indicative of an average current passed by the low-side transistor 218 during the measurement period. After setting the capacitor to the $V_{int}$ voltage, and prior to the discharge of the capacitor 234, the SAMPLE control signal is set to logic 0 and the switch 242 is opened. Opening of the switch 242 maintains the charge on capacitor 246 and the $V_{ave}$ voltage at the output node, when capacitor 246 is discharged.

Figure 3:
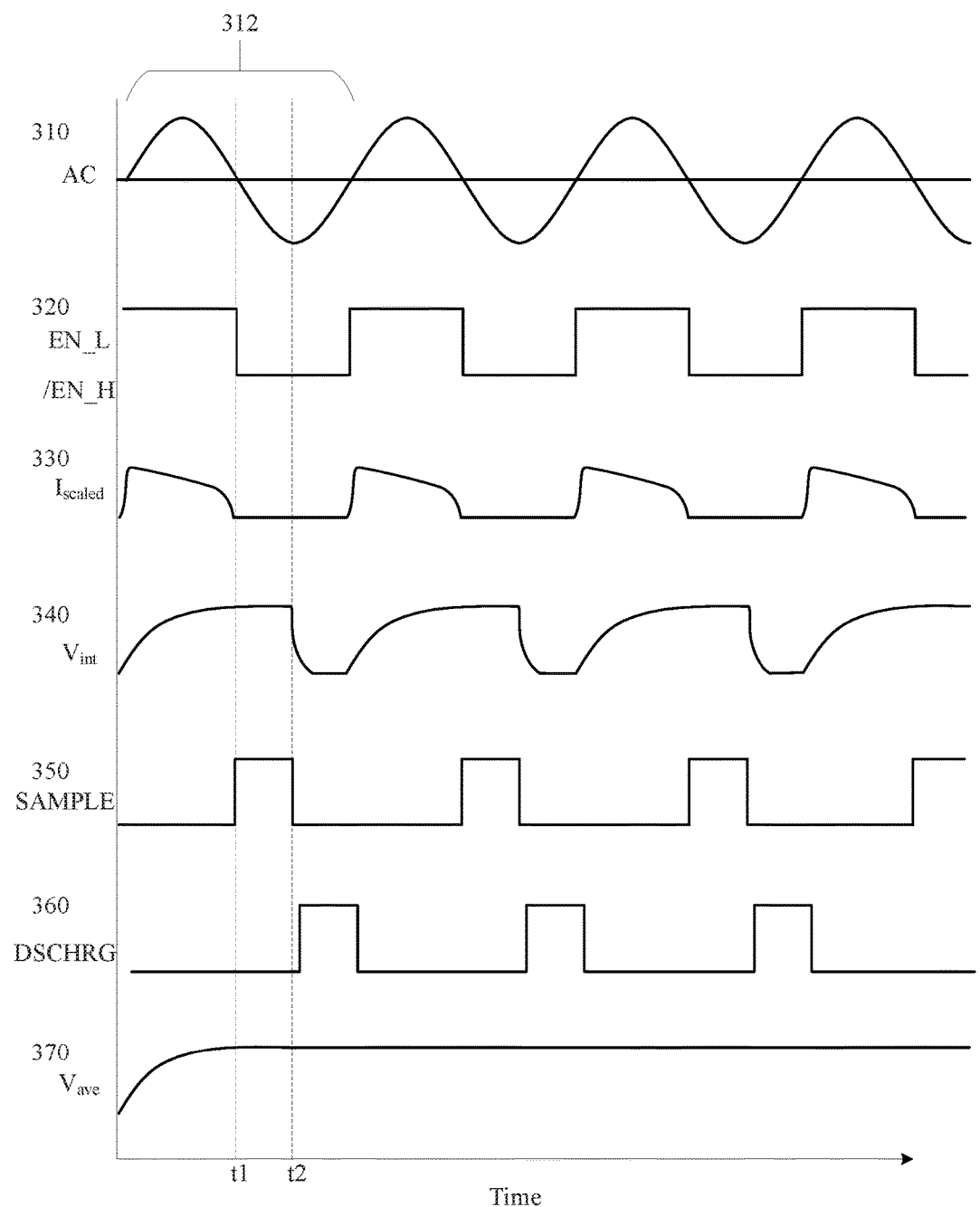
FIG. 3 shows an example set of waveforms generated during operation of the power converter shown in FIG. 2, consistent with one or more embodiments of the present disclosure.

FIG. 3 shows an example set of waveforms generated during operation of the power converter shown in FIG. 2, consistent with one or more embodiments of the present disclosure. Waveform 310 shows a voltage of node 203 relative to a voltage of node 204 when an AC signal is provided to the AC nodes by the AC voltage source 202. For ease of explanation, the example operation is described with reference to an implementation where the EN_L and EN_H control signals are the same. For ease of reference, the EN_L and EN_H control signals may be jointly referred to as EN_L/EN_H. Waveform 320 shows an example control signal EN_L/EN_H for controlling switching of transistors 212, 214, 216, and 218 in bridge rectifier 210. In a first half of each cycle (e.g., 312) of the AC signal shown in waveform 310, the voltage of the node 203 of the AC voltage source is higher than the voltage of the node 204 of the AC voltage source. In this time period, EN_L/EN_H is set to logic 1, which causes transistor 212 to couple the higher voltage on node 203 to DC node 205 and causes transistor 218 to couple the lower voltage on node 204 to DC node 205. Conversely, in a second half of each cycle 312 of the AC waveform 310, the voltage of the AC node 203 is less than the voltage of the second AC node 204. In this time period, EN_L/EN_H is set to logic 0, which causes transistor 214 to couple the higher voltage on node 204 to DC node 205 and causes transistor 218 to couple the lower voltage on node 203 to DC node 205. As a result, of the switching operations in the rectifier, a DC current $I_{load}$ is induced in the load circuit 252 coupled to the DC nodes 205 and 206. Relative to the average current of the load, the average current $I_{branch}$ through each transistor in the rectifier 210 is given by $$I_{branch} = I_{load}/2.$$

Waveform 330 shows the $I_{scaled}$ current generated by the current-controlled current source 220. As previously described, the $I_{scaled}$ current may be a scaled version of the current passed by the low-side transistor 218 and is used to charge capacitor 234. Waveform 340 shows voltage ($V_{int}$) across the capacitor 234 during operation. In this example, the capacitor is charged for a measurement period equal to the first half of one clock cycle. The total charge (Q) of the capacitor is given by $$Q = I_{branch} * Tp/2 \int_{t0}^{t1} k * I_{branch}(t) dt$$

where Tp is the cycle length and k is the ratio between the $I_{branch}$ current and the $I_{scaled}$ current.

Waveform 350 shows an example SAMPLE control signal for triggering sampling of the $V_{int}$ waveform 340 by the sample and hold circuit 240. At time t1 at the end of the measurement period, waveform 350 is set to logic 1 to cause the sample and hold circuit 240 to sample the waveform 340. The voltage of the capacitor $V_{int}$ and the time t1 and the voltage of output node $V_{ave}$ is given by $$V_{int} = V_{int\,t1} = \frac{k * I_{load}}{4 * Freq * Cprm}$$

At time t2, following sampling by the sample and hold circuit 240, the SAMPLE control signal is set to logic 0, which causes switch 242 to uncouple the capacitor 246 from capacitor 234 and maintain the voltage of capacitor 246. Waveform 360 shows an example control signal DSCHRG for triggering discharge of the capacitor 234. At time t2, the DSCHRG control signal is set to logic 1 to cause the switch 232 in the integration circuit 230 to discharge the voltage $V_{int}$ of the capacitor 234. Waveform 370 shows the voltage $V_{ave}$ of output node 248. Because $V_{int}$ is indicative of the average load current $I_{load}$ at time t1, the voltage maintained by sample and hold circuit 240 is indicative of the average current passed by low-side transistors 218 and of the average load current $I_{load}$. The load current $I_{load}$ is approximately equal to $$I_{load} = \frac{V_{ave} * 4 * Freq * Cprm}{k}$$

Figure 4:
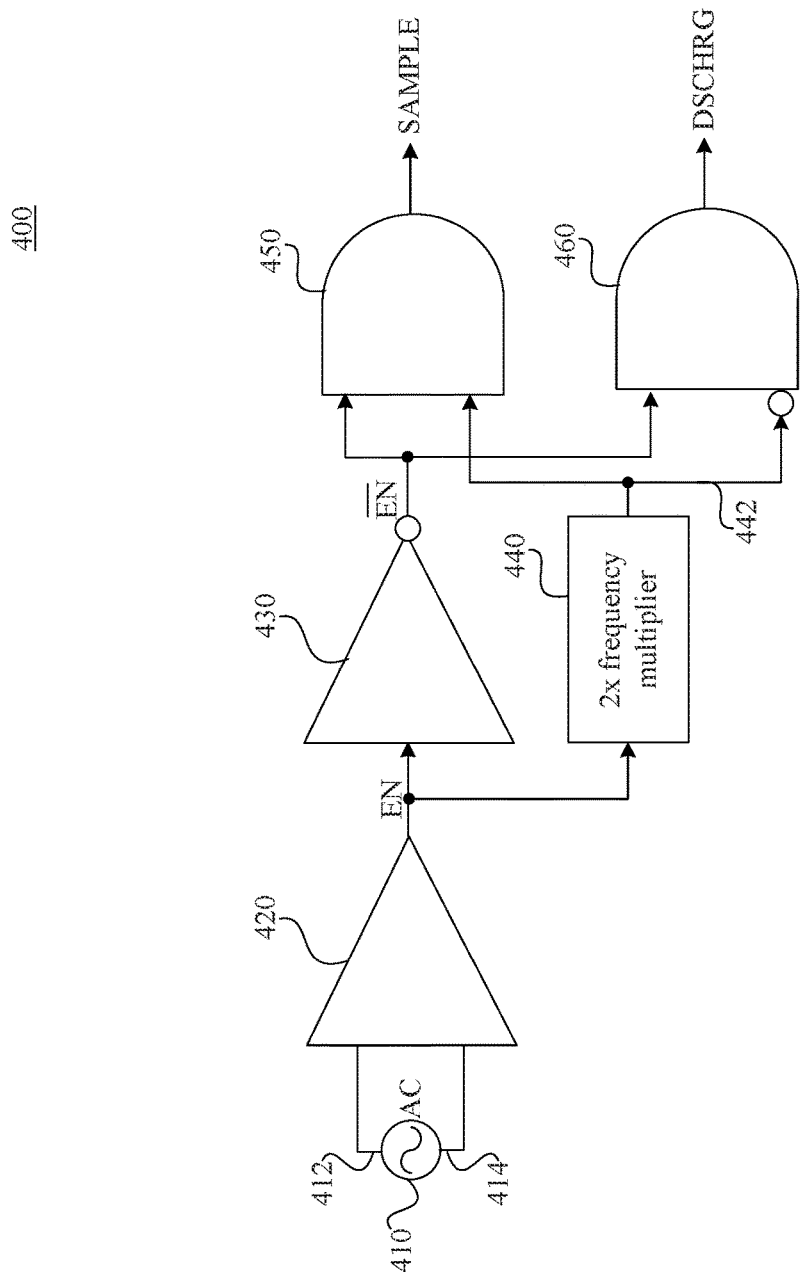
FIG. 4 shows a block diagram of a control circuit for operating transistors in an active-rectifier, consistent with one or more embodiments of the present disclosure.

FIG. 4 shows a block diagram of a power control circuit for generating control signals for operating a power converter, consistent with one or more embodiments of the present disclosure. The power control circuit may be used, for example, to generate the EN, $\overline{EN}$, SAMPLE, and DSCHRG shown in FIG. 3. The circuit 400 includes a comparator circuit 420 having a first input coupled to a first terminal 412 of AC voltage source 410 and a second input coupled to a second terminal 414 of the AC voltage source 410. The comparator circuit 420 sets an enable signal EN_L/EN_H to logic 0 when the voltage of the first terminal 412 is greater than the second terminal 414. Conversely, the comparator circuit 420 sets EN_L/EN_H to logic 1 when the voltage of the second terminal 414 is greater than the first terminal 412. The circuit 400 also includes an inverter circuit 430 configured to generate the control signal $\overline{EN\_L/EN\_H}$ that is the inverse of EN. A 2× frequency multiplier 440 multiplies a frequency of the EN_L/EN_H control signal to produce an alternating binary signal 442 having a cycle length that is half that of EN_L/EN_H. A first logical AND circuit 450 is configured to perform a logical AND of the control signal $\overline{EN\_L/EN\_H}$ and the alternating binary signal 442 to produce the SAMPLE control signal. As shown in FIG. 3, the SAMPLE control signal is set to logic 1 in a first portion of the second half of each cycle, for example, beginning at time t1 in cycle 312. A second logical AND circuit 460 is configured to perform a logical AND of the control signal $\overline{EN\_L/EN\_H}$ and an inverse of the alternating binary signal 442 to produce the DSCHRG control signal. The DSCHRG control signal is set to logic 1 in a second portion of the second half of each cycle, for example, beginning at time t2 in cycle 312.

Figure 5:
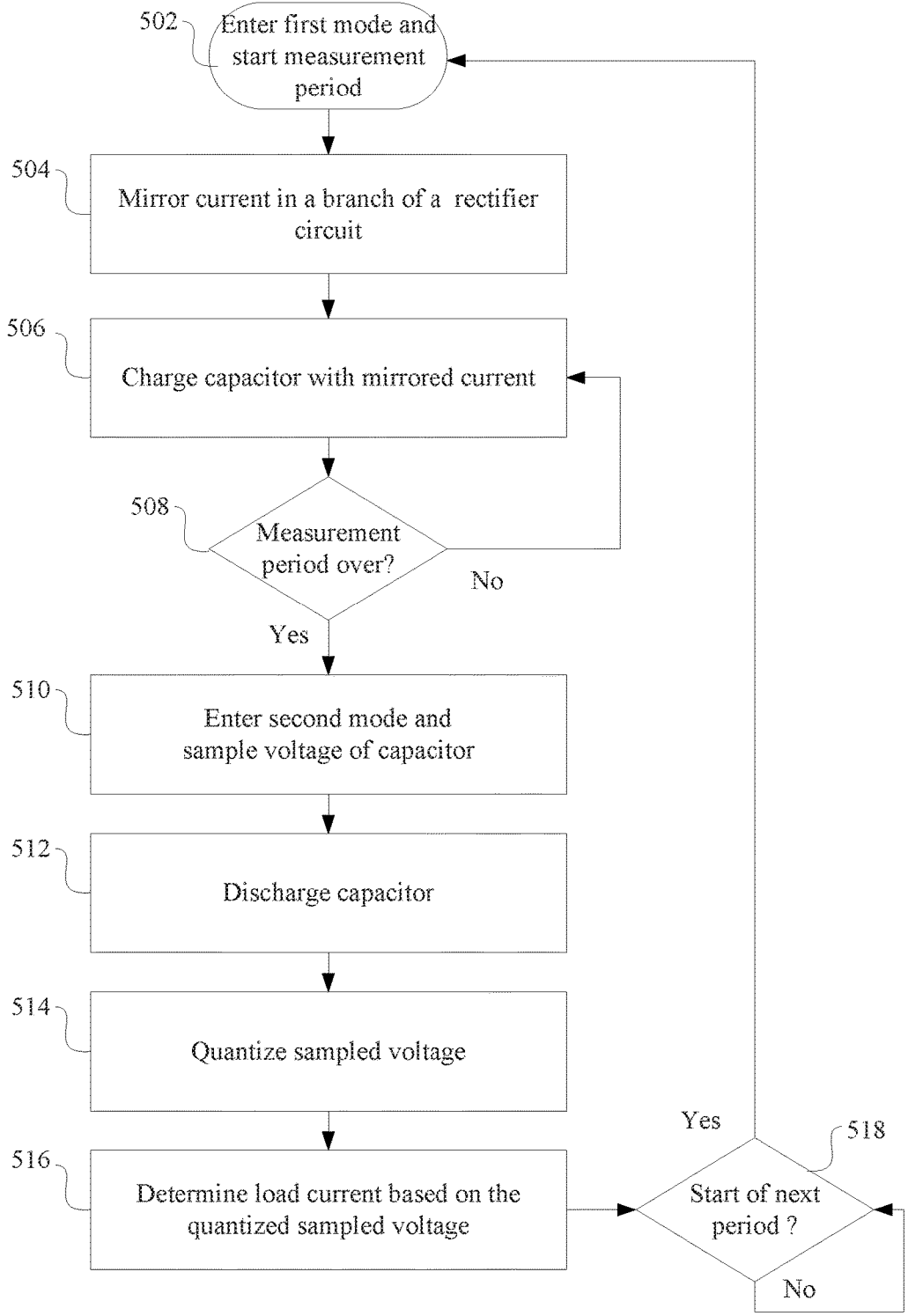
FIG. 5 shows a process for determining load current provided by a rectifier circuit, consistent with one or more embodiments of the present disclosure.

FIG. 5 shows an example process for determining load current provided by a rectifier circuit, consistent with one or more embodiments of the present disclosure. At the start of a measurement period, per block 502, current in a branch of the rectifier is mirrored at block 504 to produce a mirrored current. The mirrored current may be a scaled version of the current through the branch. In some embodiments, the mirroring can be continuously occurring throughout the process and does not need to start or stop upon entering or existing block 504. At block 506, a capacitor is charged with the mirrored current. The voltage on the capacitor can represent an integration of the current over the measurement period. At the end of the measurement period, decision block 508 directs the process to block 510. The end of the measurement period can be determined according a variety of different solutions. According to one solution, the measurement period can be responsive to cycle transitions of the AC power. For example, the measurement period can be configured to end in response to the branch being monitored becoming inactive/nonconductive. If the measurement period corresponds to a single cycle, the end of the measurement period can be triggered each time the branch becomes inactive. If the measurement period corresponds to multiple cycles, then a counter circuit can be used to end the measurement period after a set number of cycles are detected. Another example includes the use of a clock that is synchronized to the AC power (e.g., using a phase-locked loop) or a timing circuit that is used to end the measurement after a set amount of time.

At block 510, the voltage of the capacitor is sampled. The capacitor is discharged at block 512. At block 514, the sampled voltage is quantized, for example with an analog to digital converter, to produce a digital value. At block 516, the load current is determined based on the digital value. At the start of the next measurement period, decision block 518 directs the process back to block 502 and the process is repeated.

Figure 6:
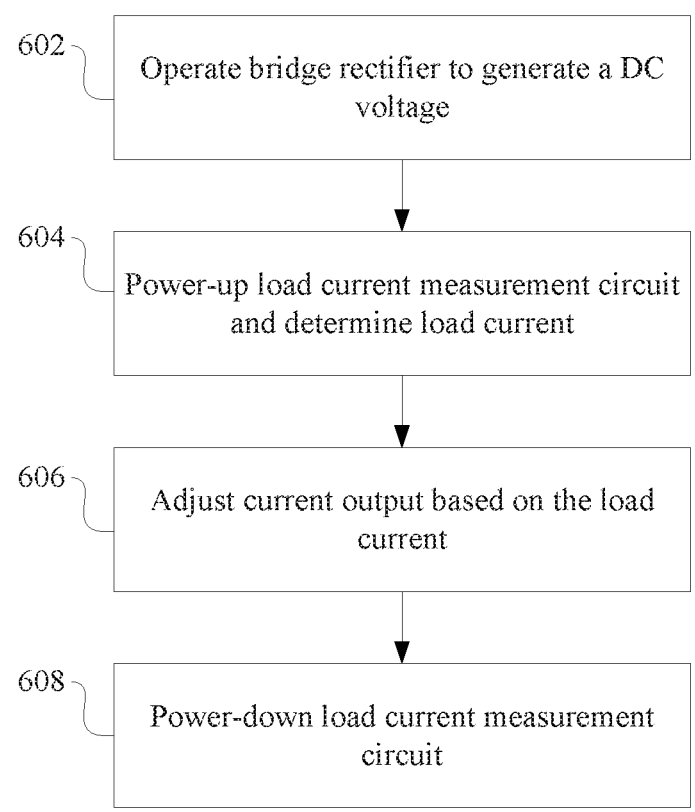
FIG. 6 shows an example process for operating a power converter, consistent with one or more embodiments of the present disclosure.

FIG. 6 shows an example process for operating a power converter, consistent with one or more embodiments of the present disclosure. At block 602, a DC voltage is generated using a bridge rectifier. At block 604, a load current measurement circuit is powered up and a load current is determined as described with reference to FIGS. 1-5. At block 606, current output of the power converter is adjusted based on the determined load current. For example, a wireless charger may adjust the frequency and/or amplitude of an electromagnetic field used for wireless transfer of AC power to the power converter. After adjusting current output, load current measurements may no longer be required. In this example, the load current measurement circuit is powered down at block 608. By powering down the load current measurement circuit, power efficiency of the power converter is improved in comparison to load current measurement techniques that utilize a resistor in series with the load, which continues to dissipate power.

In some embodiments, the process may return back to block 604 after a period of time and power-up the load current measurement circuit so a new load current may be measured. In some implementations, the power converter may be configured to periodically power the load current measurement circuit for brief periods of time so load current may be measured. Such an approach may be useful for applications in which load current may change over time. In response to detecting a change in the load current, current output of the power converter may be readjusted based on the new load current.

Figure 7:
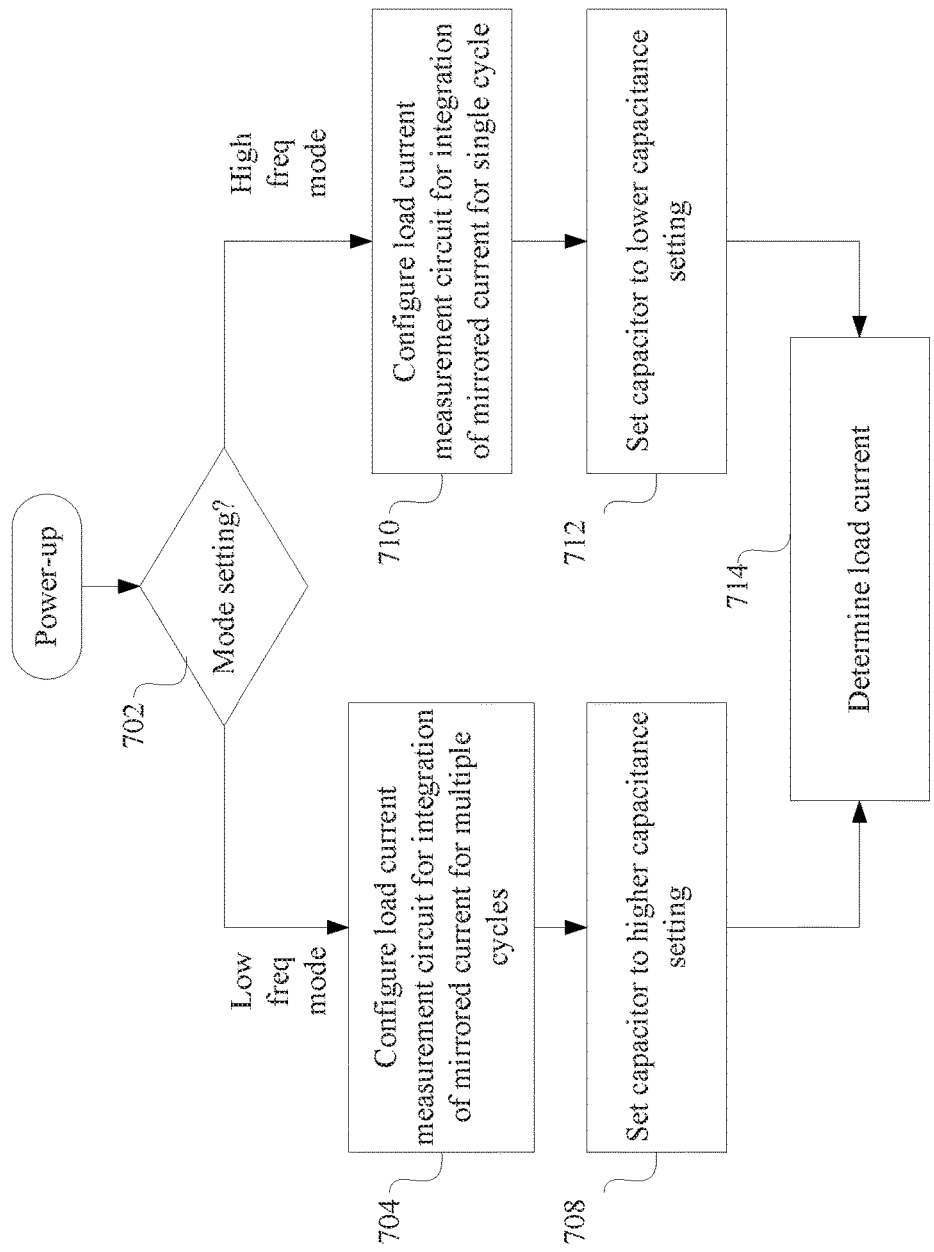
FIG. 7 shows an example process for configuring a load current measurement circuit, consistent with one or more embodiments of the present disclosure.

FIG. 7 shows an example process for configuring a load current measurement circuit, consistent with one or more embodiments of the present disclosure. For ease of explanation, the process is discussed with reference to load current measurement circuit 260 in FIG. 2. In this example, the load current measurement circuit 260 may be configured to operate in different modes according to a mode setting. In some implementations, the mode setting may be indicated by a control signal input communicated to the load current measurement circuit (e.g., by a wireless charger). In some other implementations, the mode setting may be specified by a value stored in a non-volatile memory coupled to the load current measurement circuit 260. In this example, the process is configured to either a low frequency mode or a high frequency mode. However, in some embodiments the load current measurement circuit may be configured to operate in other modes, in addition to or in lieu of the two modes shown in FIG. 7. If the mode setting indicates the low frequency mode, decision block 702 directs the process to block 704. As previously discussed, lower frequency AC voltages may exhibit greater variation in the length of cycles relative to higher frequency AC voltages. At block 704, the load current measurement circuit 260 is configured for integration of the mirrored current (e.g, $I_{scaled}$) for multiple cycles to improve accuracy. The configuration may set a control circuit that provides the DSCHRG control signal to trigger discharge of the capacitor 234 after a particular number of cycles. At block 708, the capacitor is set to a higher capacitance setting. After setting the capacitance of the capacitor at block 708, the load current measurement circuit is operated at block 714 to determine the load current.

If the mode setting indicates the low frequency mode, decision block 702 directs the process to block 710. At block 710, the load current measurement circuit 260 is configured for integration of the mirrored current for a single cycle. The configuration may be performed by setting a control circuit that provides the DSCHRG control signal to trigger discharge of the capacitor 234 at the end of each cycle. Because less energy is provided to the capacitor in the high frequency mode, the capacitor is set to a lower capacitance setting at block 712. As previously discussed, the lower capacitance setting improves accuracy of load current measurement when the mirror current is integrated for a single cycle. After setting the capacitance of the capacitor at block 712, the load current measurement circuit is operated at block 714 to determine the load current.

Various blocks, modules or other circuits may be implemented to carry out one or more of the operations and activities described herein and/or shown in the figures. In these contexts, a "block" (also sometimes "circuit", "logic circuitry", or "module") can be implemented using a circuit that carries out one or more of these or related operations/activities. In various embodiments, a hard-wired control block can be used to minimize the area for such an implementation in case a limited flexibility is sufficient. Alternatively and/or in addition, in certain of the above-discussed embodiments, one or more modules are discreet logic circuits or programmable logic circuits configured and arranged for implementing these operations/activities.

Based upon the above discussion and illustrations, those skilled in the art will readily recognize that various modifications and changes may be made to the various embodiments without strictly following the exemplary embodiments and applications illustrated and described herein. For example, although aspects and features may in some cases be described in individual figures, it will be appreciated that features from one figure can be combined with features of another figure even though the combination is not explicitly shown or explicitly described as a combination. Such modifications do not depart from the true spirit and scope of various aspects of the invention, including aspects set forth in the claims.

What is claimed is:

1. An apparatus, comprising:
   a bridge rectifier circuit having first and second AC nodes, first and second DC nodes, and a set of transistors forming branches between the AC and DC nodes; and
   a load current measurement circuit including:
   a current-controlled current source comprising a pair of transistors connected in series between one of the first and second AC nodes of the bridge rectifier circuit and to a voltage source, the current-controlled current source configured and arranged to generate a mirrored current that is a scaled version of a current through at least one of the set of transistors;
   a current integration circuit including a capacitor and configured and arranged to integrate the mirrored current by:
   charging the capacitor with the scaled current in a first mode; and
   discharging the capacitor in a second mode; and
   a sample and hold circuit configured and arranged to set an output node to a voltage equal to a voltage stored by the capacitor in response to the current integration circuit entering the second mode and prior to the discharge of the capacitor.

2. The apparatus of claim 1, wherein the voltage at the output node is indicative of an average current provided to a load circuit via the first and second DC nodes.

3. The apparatus of claim 1, wherein a control electrode of one of the transistors connected in series is connected to a control electrode of one of the set of transistors.

4. The apparatus of claim 1, wherein the set of transistors in the bridge rectifier circuit includes:
   a first high-side transistor configured and arranged to provide a current path between the first AC node and the first DC node when enabled;
   a first low-side switch configured and arranged to provide a current path between the first AC node and a second DC node when enabled;
   a second high-side transistor configured and arranged to provide a current path between the second AC node and the first DC node when enabled; and
   a second low-side switch configured and arranged to provide a current path between the second AC node and the second DC node when enabled.

5. The apparatus of claim 4, wherein the bridge rectifier circuit further includes a control circuit configured to:
   enable the first high-side transistor and second low-side transistor and disable the second high-side transistor and first low-side transistor in response to a voltage of the first AC node being greater than a voltage of the second AC node; and
   disable the first high-side transistor and second low-side transistor and enable the second high-side transistor and first low-side transistor in response to a voltage of the first AC node being less than a voltage of the second AC node.

6. The apparatus of claim 1, wherein the current integration circuit is configured and arranged to, in response to a control signal being set to a first value:
   operate in the first mode during a first half of each cycle of an AC signal provided to the first and second AC nodes; and
   operate in the second mode during a second half of each cycle of the AC signal.

7. The apparatus of claim 6, wherein the current integration circuit is configured and arranged to operate in the first mode for a period of time including multiple cycles of the AC signal in response to the control signal being set to a second value.

8. The apparatus of claim 7, further comprising a power control circuit configured to power up the load current measurement circuit in a first time period and power down the load current measurement circuit in a second time period.

9. The apparatus of claim 1, wherein the capacitor of the current integration circuit is a programmable capacitor.

10. The apparatus of claim 1, further comprising an IC package including the bridge rectifier circuit and the load current measurement circuit.

11. A method, comprising:
   using a bridge rectifier circuit to convert an AC voltage between first and second AC nodes to a DC voltage between first and second DC nodes, wherein the bridge rectifier comprises a set of transistors forming branches between the AC and DC nodes;
   generating a mirrored current that is a scaled version of a current through at least one branch in the bridge rectifier circuit by connecting a transistor between one of the first and second AC nodes and a current mirror to generate the mirrored current;
   in a first mode, charging a capacitor with the scaled current;
   in a second mode,
   sampling a voltage stored by the capacitor, and
   after sampling the voltage, setting an output node to a voltage equal to the sampled voltage and discharging the capacitor.

12. The method of claim 11, wherein the voltage at the output node is indicative of an average current provided to a load circuit via the first and second DC nodes.

13. The method of claim 12, further comprising quantizing the voltage of the output node to produce a digital value.

14. The method of claim 13, further comprising determining a current through the load circuit based on the digital value and a lookup table indicating currents for a plurality of digital values.

15. The method of claim 11, wherein the bridge rectifier circuit includes:
   a first high-side transistor configured and arranged to provide a current path between the first AC node and the first DC node when enabled;
   a first low-side switch configured and arranged to provide a current path between the first AC node and a second DC node when enabled;
   a second high-side transistor configured and arranged to provide a current path between the second AC node and the first DC node when enabled; and
   a second low-side switch configured and arranged to provide a current path between the second AC node and the second DC node when enabled.

16. The method of claim 15, further comprising:
   enabling the first high-side transistor and second low-side transistor and disabling the second high-side transistor and first low-side transistor in response to a voltage of the first AC node being greater than a voltage of the second AC node; and
   disabling the first high-side transistor and second low-side transistor and enabling the second high-side transistor and first low-side transistor in response to a voltage of the first AC node being less than a voltage of the second AC node.

17. The method of claim 16, further comprising operating in the first mode for a period of time including multiple cycles of an AC signal.

18. The method of claim 11, further comprising:
   operating in the first mode during a first half of each cycle of an AC signal provided to the first and second AC nodes; and
   operating in the second mode during a second half of each cycle of the AC signal.

19. The method of claim 11, further comprising adjusting a capacitance exhibited by the capacitor in response to a control signal.

20. The method of claim 11, wherein the generating of the mirrored current, charging and discharging of the capacitor, sampling of the voltage stored by the capacitor, and setting of the output node to the sampled voltage is performed using a measurement circuit coupled to the bridge rectifier circuit; and
   further comprising:
   determining an average current through a load circuit coupled to the first and second DC nodes based on the voltage of the output node, and
   powering down the measurement circuit after determining the average current.

* * * * *